(12) United States Patent  
Kim (10) Patent No.: US 7,732,853 B2
(45) Date of Patent: Jun. 8, 2010

(54) MULTI-BIT NONVOLATILE MEMORY DEVICES INCLUDING NANO-CRYSTALS AND TRENCH

(75) Inventor: Il-gweon Kim, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 569 days.

(21) Appl. No.: 11/458,128

(22) Filed: Jul. 18, 2006

(65) Prior Publication Data

US 2007/0057313 A1 Mar. 15, 2007

(30) Foreign Application Priority Data

Jul. 18, 2005 (KR) ...................... 10-2005-0064963

(51) Int. Cl.
*H01L 29/788* (2006.01)

(52) U.S. Cl. ........................ 257/315; 257/316; 257/317; 257/320; 257/318; 257/366; 257/387; 257/E29.134; 257/E29.138

(58) Field of Classification Search .................. 257/315, 257/316, 317, 320, 318, 366, 387, E29.134, 257/E29.138

See application file for complete search history.

(56) References Cited

U.S. PATENT DOCUMENTS 5,021,845 A * 6/1991 Hashimoto .................. 257/331
5,923,046 A * 7/1999 Tezuka et al. ................. 257/24
6,081,662 A * 6/2000 Murakami et al. ............ 703/14
6,236,082 B1 * 5/2001 Kalnitsky et al. ............ 257/315
6,525,397 B1 * 2/2003 Kalnitsky et al. ........... 257/529
6,734,105 B2   5/2004 Kim
7,221,030 B2 * 5/2007 Saito .......................... 257/374
2005/0082600 A1 * 4/2005 Hsu et al. .................... 257/317

FOREIGN PATENT DOCUMENTS

| JP | 2001-35942 A | 2/2001 |
| JP | 2002-100687 A | 4/2002 |
| KR | 2002-0038274 A | 5/2003 |

* cited by examiner

*Primary Examiner*—Wael Fahmy
*Assistant Examiner*—Marc Armand
(74) *Attorney, Agent, or Firm*—Myers Bigel Sibley & Sajovec, P.A.

(57) ABSTRACT

Nonvolatile integrated circuit memory devices having a 2-bit memory cell include a substrate, a source region and a drain region in the substrate, a step recess channel between the source region and the drain region, a trapping structure including a plurality of charge trapping nano-crystals on the step recess channel, and a gate on the trapping structure. Related fabrication methods are also described.

10 Claims, 11 Drawing Sheets

MULTI-BIT NONVOLATILE MEMORY DEVICES INCLUDING NANO-CRYSTALS AND TRENCH

CROSS REFERENCE TO RELATED APPLICATION

This application claims the benefit under 35 USC §119 of Korean Patent Application No. 10-2005-0064963, filed on Jul. 18, 2005, the disclosure of which is hereby incorporated herein by reference in its entirety as if set forth fully herein

FIELD OF THE INVENTION

The present invention relates to nonvolatile memory integrated circuit devices, and more particularly, to multi-bit nonvolatile integrated circuit memory devices and methods for fabricating the same.

BACKGROUND OF THE INVENTION

Nonvolatile memory integrated circuit devices can maintain stored data even if the power is turned off. Thus, the nonvolatile memory integrated circuit devices are widely used in information communication devices such as digital cameras, cellular phones, personal digital assistants (PDA), MP3 players and many other applications. The nonvolatile memory integrated circuit devices should have large capacity and high integration density in order to be used in high-function and multi-function information communication devices. There is an increasing demand for high integration of memory cells of the nonvolatile memory integrated circuit devices and lower cost per Mbyte. To meet this demand, a multi-bit (e.g., 2-bit) nonvolatile memory cell has been developed.

In a conventional 2-bit nonvolatile memory cell, four threshold voltage levels are set and the set threshold voltage levels indicate different states. However, as the gate line width of the 2-bit nonvolatile memory cell decreases, due to increased integration density, short channel effects may make it difficult to distinguish threshold voltages. Moreover, since the influence of hot carriers may increase due to a short channel, electrons may be gradually trapped in a tunneling layer. As a result, larger numbers of defective devices may be manufactured and the non-defective devices may have low quality. An increase in an operating voltage for the purpose of enlarging a program acceptance window may not be desirable because it may reduce device reliability and/or may increase the interference between memory cells.

SUMMARY OF THE INVENTION

According to some embodiments of the present invention, a nonvolatile memory integrated circuit device having a multi-bit memory cell includes a substrate, a source region and a drain region in the substrate, a step recess channel between the source region and the drain region, a trapping structure including a plurality of charge trapping nano-crystals on the step recess channel, and a gate on the trapping structure.

According to other embodiments of the present invention, a nonvolatile memory integrated circuit device includes a substrate, a source region and a drain region in the substrate, a step recess channel between the source region and the drain region, a gate insulating layer and a main gate on a portion of the step recess channel, a sidewall gate insulated from and on sidewalls of the main gate and extending on the substrate, and a trapping structure interposed between the sidewall gate and a remaining portion of the step recess channel and including a plurality of charge trapping nano-crystals.

According to still other embodiments of the present invention, a nonvolatile memory integrated circuit device includes a plurality of active regions in a substrate, a plurality of ground selection lines and string selection lines intersecting the plurality of active regions, a plurality of parallel word lines arranged between the plurality of ground selection lines and string selection lines and traversing upper portions of the active regions and a plurality of strings in each of the active regions. Each of the strings are formed by serially connecting a string selection transistor, a plurality of memory cells, and a ground selection transistor. Each of the string selection transistor, the memory cells, and the ground selection transistor includes a step recess channel on the substrate, a trapping structure including a plurality of charge trapping nano-crystals on the step recess channel, and a gate on the trapping structure. A plurality of common source lines intersect the plurality of active regions and connect a source of the ground selection transistor. A plurality of bit lines which are parallel to each of the active regions are provided, in each of which a plurality of strings for each of the active regions is connected in parallel.

Multi-bit nonvolatile memory cells according to still other embodiments of the present invention include a substrate, spaced apart source and drain regions in the substrate, a trench in the substrate between the spaced apart source and drain regions and a gate on the substrate that extends into the trench. A plurality of charge trapping nano-crystals are provided on the substrate between the spaced apart source and drain regions. In some embodiments, the plurality of charge trapping nano-crystals extend both into the trench and along the substrate outside the trench. In other embodiments, the gate includes a gate sidewall that extends outside the trench away from the substrate and the plurality of charge trapping nano-crystals extend both along the substrate outside the trench and along the gate sidewall outside the trench away from the substrate. In some embodiments, the gate extends both into the trench and on the substrate outside the trench. In some embodiments, the trench is closer to the source region than to the drain region. In some embodiments, the trench includes an opening, a floor and a sidewall therebetween, and the opening in chamfered. In other embodiments, the floor is nonplanar. In still other embodiments, the sidewall is stepped. In yet other embodiments, the charge trapping nano-crystals extend on the substrate adjacent to, but spaced apart from, the source and drain regions. In still other embodiments, a layer is provided between the nano-crystals and the substrate, that is thicker on the substrate outside the trench than in the trench.

According to further embodiments of the present invention, a method of fabricating a nonvolatile memory integrated circuit device includes forming a step recess channel in a substrate, forming a stacked structure having a trapping structure including a plurality of charge trapping nano-crystals and a gate electrode on the step recess channel, and forming a source region and a drain region in the substrate where the stacked structure is formed.

According to yet other embodiments of the present invention, a method of fabricating a nonvolatile memory integrated circuit device includes forming a step recess channel in a substrate, forming a gate insulating layer and a main gate on a portion of the step recess channel, forming a trapping structure including a plurality of charge trapping nano-crystals between sidewall gates isolated at sidewalls of the main gate and between lower portions of the sidewall gates and a remaining region of the step recess channel, and forming a source region and a drain region in the substrate.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

The invention will be described more fully hereinafter with reference to the accompanying drawings, in which example embodiments of the invention are shown. This invention may, however, be embodied in many different forms and should not be construed as limited to the example embodiments set forth herein. Rather, the disclosed embodiments are provided so that this disclosure will be thorough and complete, and will fully convey the scope of the invention to those skilled in the art. In the drawings, the size and relative sizes of layers and regions may be exaggerated for clarity. Moreover, each embodiment described and illustrated herein includes its complementary conductivity type embodiment as well. Like numbers refer to like elements throughout.

It will be understood that when an element or layer is referred to as being "on", "connected to" and/or "coupled to" another element or layer, it can be directly on, connected or coupled to the other element or layer or intervening elements or layers may be present. In contrast, when an element is referred to as being "directly on," "directly connected to" and/or "directly coupled to" another element or layer, there are no intervening elements or layers present. As used herein, the term "and/or" may include any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms may be used to distinguish one element, component, region, layer and/or section from another region, layer and/or section. For example, a first element, component, region, layer and/or section discussed below could be termed a second element, component, region, layer and/or section without departing from the teachings of the present invention.

Spatially relative terms, such as "beneath", "below", "lower", "above", "upper" and the like, may be used herein for ease of description to describe an element and/or a feature's relationship to another element(s) and/or feature(s) as illustrated in the figures. It will be understood that the spatially relative terms are intended to encompass different orientations of the device in use or operation in addition to the orientation depicted in the figures. For example, if the device in the figures is turned over, elements described as "below" and/or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular terms "a", "an" and "the" are intended to include the plural forms as well, unless the context clearly indicates otherwise. It will be further understood that the terms "comprises," "comprising," "includes" and/or "including" when used in this specification, specify the presence of stated features, integers, steps, operations, elements, and/or components, but do not preclude the presence or addition of one or more other features, integers, steps, operations, elements, components, and/or groups thereof.

Example embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, may be expected. Thus, the disclosed example embodiments of the invention should not be construed as limited to the particular shapes of regions illustrated herein unless expressly so defined herein, but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention, unless expressly so defined herein.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Hereinafter, a nonvolatile memory cell in which the program acceptance window of a source-side injection program and the program acceptance window of a drain-side injection program can be clearly separated will be described with reference to the accompanying drawings. In the following description, to distinguish a source region from a drain region of a nonvolatile memory cell, the drain region is assumed to be a region to which the higher voltage is applied during a read operation.

Figure 1:
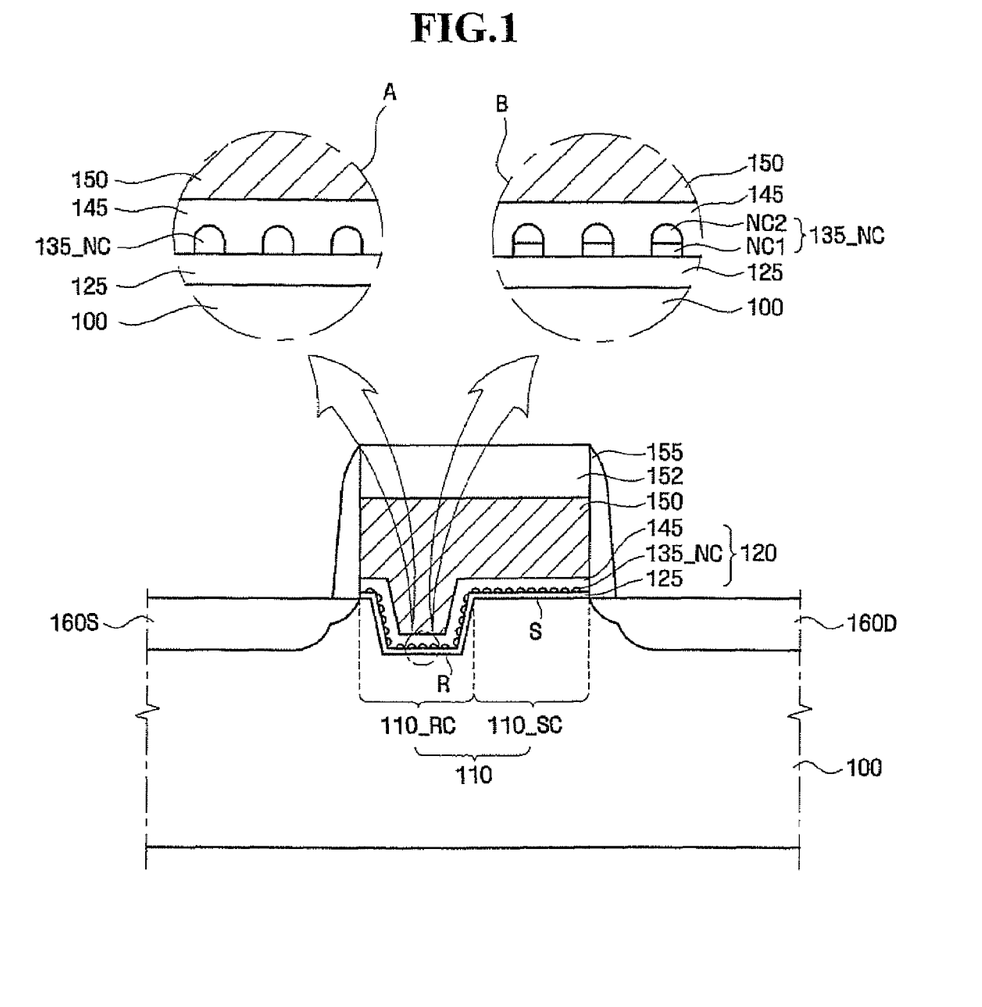
FIG. 1 is a cross-sectional view of a unit memory cell of a nonvolatile memory integrated circuit device according to embodiments of the present invention.

FIG. 1 is a cross-sectional view of a unit memory cell of a nonvolatile memory integrated circuit device according to embodiments of the present invention.

Referring to FIG. 1, a unit memory cell includes a step recess channel 110, a charge trapping structure 120 including a plurality of charge trapping nano-crystals 135_NC, a gate 150, a source region 160S, and a drain region 160D.

More specifically, the source region 160S and the drain region 160D are formed in an active region defined by a device isolation region (not shown) of a substrate 100, such as a semiconductor or semiconductor-on-insulator substrate. The source region 160S and the drain region 160D may be formed as an LDD (lightly doped drain) region as shown in FIG. 1, but they may be formed only as a low-concentration or high concentration impurity region.

The step recess channel 110 is defined between the source region 160S and the drain region 160D. The step recess channel 110 is formed along a recess R formed to have a predetermined depth and a predetermined width in the substrate 100 and a step S extending from the recess R. A recess channel 110_RC may be formed adjacent to the source region 160S. In some embodiments, the program acceptance window of the source-side injection program operation and the program acceptance window of the drain-side injection program operation can be more clearly distinguished. The reason of the foregoing is as follows: Since the areas of injecting hot electrons are different at both corners of the recess channel 110_RC and an appropriate channel length is maintained, a threshold voltage difference between a drain side affected by a short-channel effect and a source side that is not affected by the short-channel effect can become more clear. However, if a cell characteristic can be changed using various methods such as by changing the profiles of the source region 160S and the drain region 160D, an impurity region adjacent to the recess channel 110_RC may serve as a drain region.

The charge trapping structure 120, including the plurality of charge trapping nano-crystals 135_NC, is on the step recess channel 110. The charge trapping structure 120 may have a stacked structure including a tunneling layer 125, the plurality of charge trapping nano-crystals 135_NC, and a blocking layer 145.

The tunneling layer 125 may be a single layer or a stacked layer formed of $SiO_2$, $SiON$, $La_2O_3$, $ZrO_2$ and/or $Al_2O_3$. The thickness of the tunneling layer 125 may be in a range of but is not limited to, about 1-100 nm, e.g., about 4.5-5.5 nm.

The plurality of charge trapping nano-crystals 135_NC may comprise a plurality of charge trapping nano-crystals having a diameter of about 1-15 nm and formed in a cluster or dot form. An interval between the charge trapping nano-crystals 135_NC may be in a range of several—several tens of nanometers, e.g., about 1-10 nm. To reduce or prevent a disturbance caused by a lateral diffusion of charges, the interval may be in a range of 5-10 nm. Since charges are trapped in the charge trapping nano-crystals 135_NC, the localized fraction of the source-side injection or the drain-side injection can be more effectively obtained when compared to using a continuous charge trapping layer (e.g., a SiN layer or a BN layer).

The charge trapping nano-crystals 135_NC may have a single-layer structure (circle A) or a multi-layer structure (circle B). The single-layer structure (circle A) may be formed of semiconductor nano-crystals and/or dielectric nano-crystals. Semiconductor nano-crystals may be polysilicon nano-crystals and/or germanium nano-crystals. The dielectric nano-crystals may be silicon nitride nano-crystals and/or germanium nitride nano-crystals. The multi-layer structure (circle B) may be formed of stacked nano-crystals including dielectric nano-crystals NC1 and semiconductor nano-crystals NC2. In some cases, an oxide may also be interposed between the dielectric nano-crystals NC1 and the semiconductor nano-crystals NC2. The dielectric nano-crystals NC1 may be formed of oxide such as SiN, BN, SiC, SiON, Al, Zr, Hf, and/or La, and/or oxynitride such as Al, Zr, Hf and/or La, and the semiconductor nano-crystals NC2 may be polysilicon nano-crystals and/or germanium nano-crystals.

The blocking layer 145 can reduce or prevent charges stored in the nano-crystals 135_NC from moving to the gate 150. Accordingly, the blocking layer 145 can comprise a single layer or a combination layer made of $SiO_2$, $Hf_xO_y$, $Al_xO_y$, $Zr_xO_y$, $Ta_xO_y$, $Hf_xSi_{1-x}O_y$, and/or $Hf_xSi_{1-x}O_yN_z$.

The gate layer 150 may be a single layer such as a doped polysilicon layer, a metal silicide layer or a metal layer, or a multiple layer such as a metal/metal barrier layer, a metal/doped polysilicon layer, a metal silicide/metal silicide layer and/or a metal silicide layer/doped polysilicon layer. Examples of the metal include, but are not limited to, W, Ni, Co, Ru—Ta, Ni—Ti, Ti—Al—N, Zr, Hf, Ti, Ta, Mo, Ta—Pt, Ta—Ti, and/or W—Ti, examples of the metallic barrier material include, but are not limited to, WN, TiN, TaN, TaCN, and/or MoN, and examples of the metal silicide include, but are not limited to, WSix, CoSix and/or NiSix. A capping layer may be further formed on the gate 150.

A spacer 155 is formed at sidewalls of the gate 150. The spacer 155 may be an oxide spacer made during an oxidation process for removing defects of a lattice structure and/or trap site caused during patterning of the gate 150 and/or a spacer used as an ion implantation mask for forming deep source/drain regions by forming and etching back an insulating layer.

Figure 2:
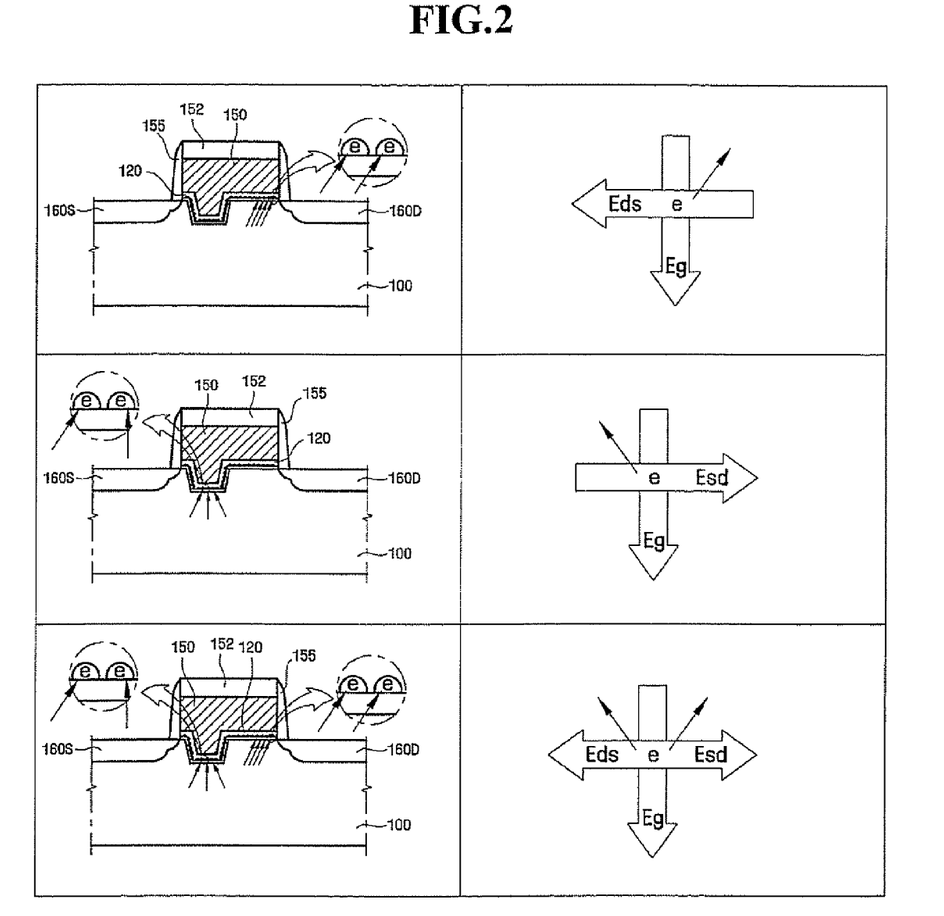
FIG. 2 is a schematic view for explaining a programming (write) operation of a unit memory cell of a nonvolatile memory integrated circuit device according to embodiments of the present invention.

FIG. 2 is a schematic view for explaining a programming (write) operation of a unit memory cell of a nonvolatile memory integrated circuit device according to some embodiments of the present invention. As shown in FIG. 2, a programming operation is done by hot electron injection.

As shown in Table 1 below, a nonvolatile memory cell in which a programming operation is not performed has a first-level threshold voltage Vt1 set during the initial formation of the memory cell.

In drain-side injection, as shown in the first row of FIG. 2, a voltage of 0V or higher, e.g., 6V, is applied to a gate electrode, a ground voltage is applied to the source region 160S, and a voltage of 0V or higher, e.g., 5V, is applied to the drain region 160D. According to the applied voltages, an inversion region is formed in the step recess channel 110, a depletion region is formed adjacent to the drain region 160D, and the inversion region is pinched off without extending to the drain region 160D. Thus, the depletion region is interposed between the drain region 160D and the inversion region. Electrons move along the inversion region formed along the step recess channel 110 and collide with a boundary between the inversion region and the depletion region, thereby generating an electron-hole pair. At this time, the generated hot electrons jump over the potential wall of the tunneling layer 125 due to the influences of a horizontal electric field Eds and a vertical electric field Eg that accelerate electrons and are then injected into the plurality of nano-crystals 135_NC arranged in the drain side. Thus, as shown in the left cross-sectional view of the first row of FIG. 2, electrons are trapped in the nano-crystals 135_NC around the drain region 160D. Thus, the memory cell has a second-level threshold voltage Vt2.

In source-side injection, as shown in the second row of FIG. 2, the voltages applied to the source region 160S and the drain region 160D are interchanged. Thus, source-side injection is performed using a principle that is substantially the same as drain-side injection. Thus, the memory cell has a third-level threshold voltage Vt3.

In source-side and drain-side injection, as shown in the third row of FIG. 2, electrons are trapped in the nano-crystals 135_NC around the drain region 160D and the source region 160S. Thus, the memory cell has a fourth-level threshold voltage Vt4.

Due to such an operating characteristic, 2-bit memory storage is possible in a single memory cell.

TABLE 1

|  | VG | VD | VS | Vt |
|---|---|---|---|---|
| Drain-side injection | ≧0 V (6 V) | ≧0 V (5 V) | 0 V | Vt2 |
| Source-side injection | ≧0 V (6 V) | 0 V | ≧0 V (5 V) | Vt3 |
| Source-side and drain-side injection | ≧0 V (6 V) | ≧0 V (5 V) | ≧0 V (5 V) | Vt4 |

Figure 3:
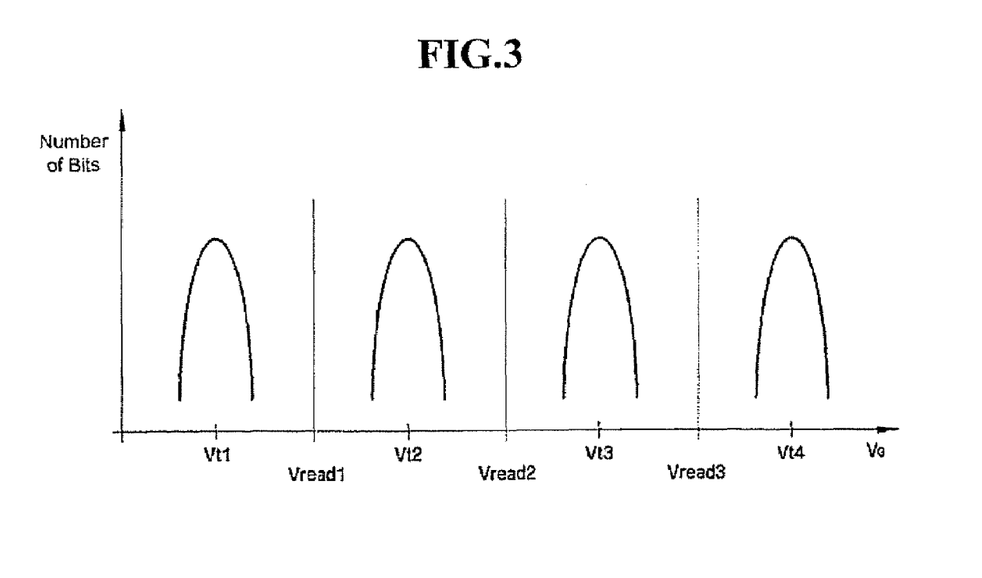
FIG. 3 is a graph showing the threshold voltage distribution of a unit memory cell of a nonvolatile memory integrated circuit device according to embodiments of the present invention.

A read operation of a nonvolatile memory cell programmed as described above according to embodiments of the present invention will be described with reference to FIG. 3. As shown in FIG. 3, the nonvolatile memory integrated circuit device may not be affected by a short channel effect by including a step recess channel. In addition, since charges are trapped in non-continuous nano-crystals, a localized fraction can be effectively obtained, contributing to an accurate read operation of drain-side injection and source-side injection.

More specifically, after the source region 160S is grounded and a predetermined voltage is applied to the drain region 160D, first through third read voltages Vread1, Vread2, and Vread3 between the first-level through fourth-level threshold voltages Vt1, Vt2, Vt3, and Vt4 are applied to the gate 150 and a programming state is checked.

Referring to FIG. 3, the threshold voltage Vt3 of a source-side injection cell is higher than the threshold voltage Vt2 of a drain-side injection cell. This is because even if the number of injected electrons existing in the form of localized fraction are the same between the source-side injection cell and the drain-side injection cell, gate voltages required for strong inversion in the step recess channel 10 during a forward read operation are different between the source-side injection cell and the drain-side injection cell.

More specifically, in the drain-side injection cell, a critical voltage is low only in the drain side in which charges are trapped and a critical voltage in the remaining region has the first-level threshold voltage Vt1. Thus, once a voltage higher than the first-level threshold voltage Vt1 is applied, an inversion layer is formed in the source region 160S and moving charges are provided to the drain side. Since a predetermined voltage is applied to the drain region 160D, a depletion region is already formed in the substrate 100 under a trapped charge region. Thus, if a gate voltage capable of forming an electric field sufficient to compensate for charges injected in the nano-crystals 135_NC, i.e., the second-level threshold voltage Vt2, is applied, the moving charges provided from the source region 160S move through the depletion region, and thus, a drain current flows.

On the other hand, if a gate voltage that is the same as the second-level threshold voltage Vt2 is applied to a gate of the source-side injection cell, only charges trapped in the source side can be compensated for. Thus, only when a gate voltage including the second-level threshold voltage Vt2 capable of compensating for the trapped charges and a voltage capable of forming an electric field sufficient to cause a strong inversion in a channel around the source region 160S is applied, a memory cell is turned on and a drain current flows. Thus, the third-level threshold voltage Vt3 shifting in source-side injection is higher than the second-level threshold voltage Vt2 shifting in drain-side injection.

Therefore, to clearly distinguish the programming states of the drain-side injection cell and the source-side injection cell, a charge injection region should be effectively fractionized. However, in a conventional flat channel memory cell, as a channel length decreases, a localized fraction area may not be distinguished. As a result, the windows of the second-level threshold voltage and the third-level threshold voltage may overlap with each other.

On the other hand, in a nonvolatile memory cell according to embodiments of the present invention, an effective channel length Leff can be longer than that of the conventional flat channel cell due to the step recess channel 110. Thus, source-side injection and drain-side injection can form a localized fraction. In particular, by adjusting the depth of the recess channel 110_RC, a more stable localized fraction can be obtained. In addition, since the influence of hot carriers, i.e., hot electrons, may be smaller due to the long effective channel length Leff when compared to a short channel, a self-limiting effect need not occur. Moreover, charges are trapped in non-continuous nano-crystals having little or no lateral diffusion, instead of being trapped in a continuous layer, which can double the effect of localized fraction.

In the recess channel 110_RC, an intense injection of hot electrons can be performed through a large area including lower corner portions. Thus, when compared to a step channel 110_S, a larger number of hot electrons can be injected and the threshold voltages of the source region 160S and the drain region 160D can be more clearly distinguished due to an appropriate channel length. Thus, by including the recess channel 110_RC in the source region 160S, larger threshold voltage shifts may occur in source-side injection when compared to the conventional flat channel.

An erase operation may be performed by F—N tunneling or hot-hole injection using various methods that are well known to those skilled in the art and a detailed description of the methods need not be given.

Accordingly, embodiments of the invention that were described in FIG. 1 can provide a multi-bit nonvolatile memory cell that comprises a substrate 100, spaced apart source 160S and drain 160D regions in the substrate, and a trench R in the substrate between the spaced apart source and drain regions. A gate 150 is provided on the substrate that extends into the trench R. A plurality of charge trapping nano-crystals 135_NC are provided on the substrate between the spaced apart source and drain regions. The plurality of charge trapping nano-crystals 135_NC extend both into the trench R and along the substrate outside the trench R. The gate 150 may extend both into the trench R and on the substrate S outside the trench. The trench R may be closer to the source region 160S than to the drain region 160D. The trench may include an opening, a floor and a sidewall therebetween. In embodiments of FIG. 1, the floor is flat, the sidewalls are sloped, and the opening is not beveled, chamfered or rounded. In other embodiments that will be described below, the opening may be chamfered, the floor may not be flat, the sidewall may be stepped and the charge trapping nano-crystals may extend adjacent to, but spaced apart from, the source and drain regions.

Figure 4:
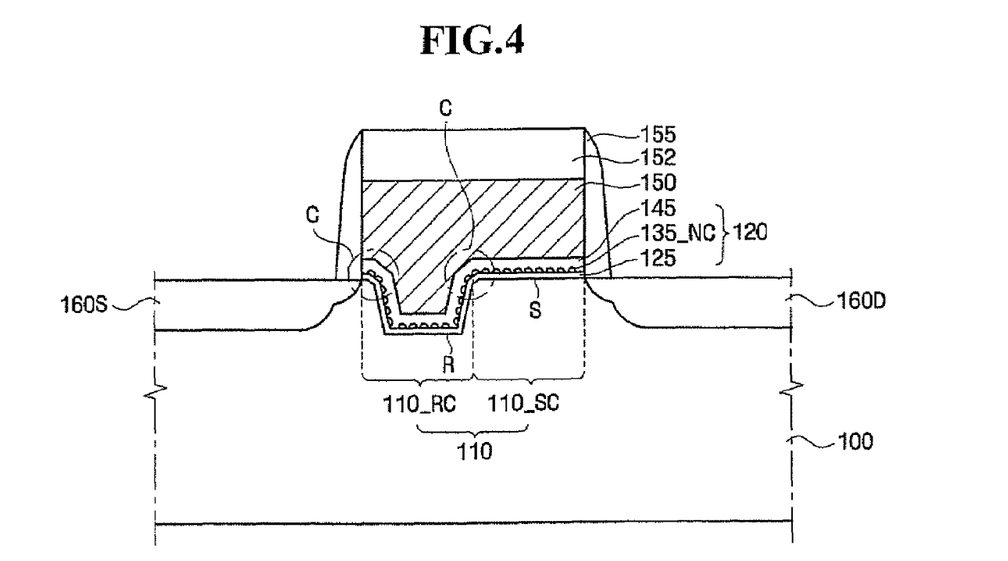
FIG. 4 is a cross-sectional view of a unit memory cell of a nonvolatile memory integrated circuit device according to other embodiments of the present invention.

FIG. 4 is a cross-sectional view of a unit memory cell of a nonvolatile memory integrated circuit device according to other embodiments of the present invention.

Embodiments of FIG. 4 are different from embodiments of FIG. 1 in that an upper portion of a recess R forming a recess channel 100_RC is chamfered and a connection portion (dotted circle C) between the recess channel 110_RC and the step channel 110_S does not have a vertical profile in which an electric field is concentrated. Chamfering includes not only straight-line forms but also rounded forms. The remaining components of embodiments of FIG. 4 are the same as those of embodiments of FIG. 1.

Figure 5:
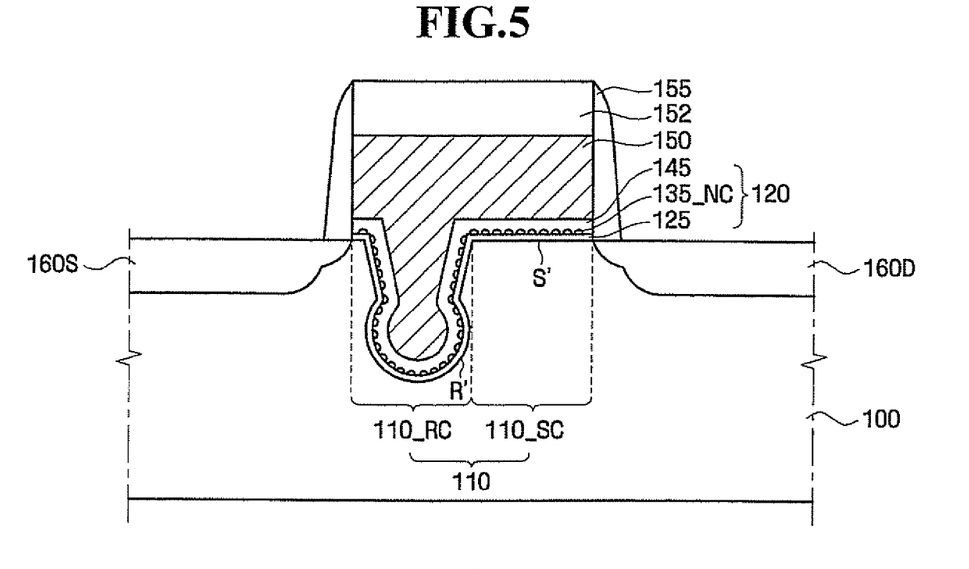
FIGS. 5 through 8 are cross-sectional views of a unit memory cell of a nonvolatile memory integrated circuit device according to still other embodiments of the present invention.

FIG. 5 is a cross-sectional view of a unit memory cell of a nonvolatile memory integrated circuit device according to still other embodiments of the present invention.

Embodiments of FIG. 5 are different from embodiments of FIG. 1 in that a lower portion (floor) of a recess R' forming a recess channel 100_RC is in a spherical shape and the remaining components of embodiments of FIG. 5 are the same as those of embodiments of FIG. 1. Since the lower portion of the recess R' has a spherical shape, the effective channel length Leff can be effectively increased. Other nonplanar floors may be used in other embodiments.

Figure 6:
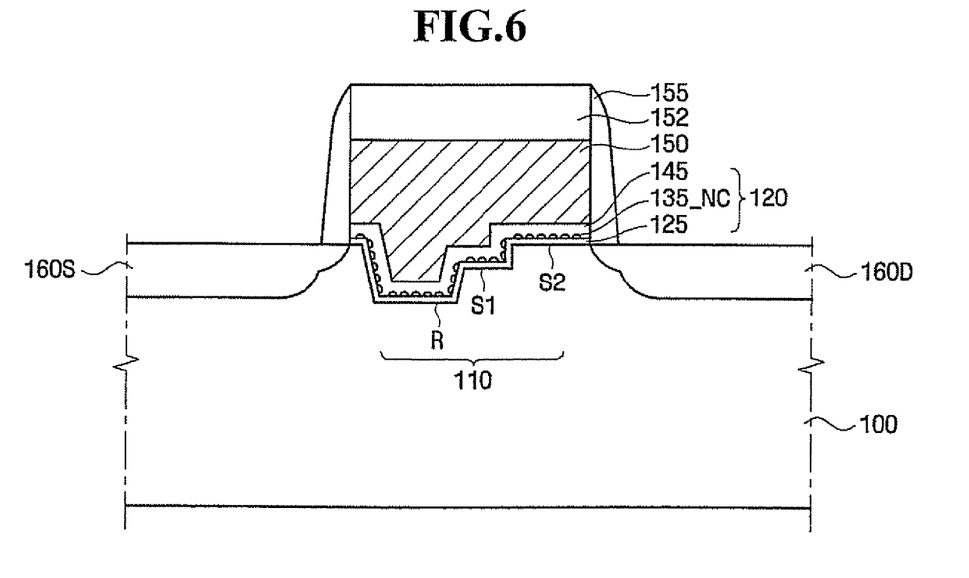

FIG. 6 is a cross-sectional view of a unit memory cell of a nonvolatile memory integrated circuit device according to still other embodiments of the present invention.

Embodiments of FIG. 6 are different from embodiments of FIG. 1 in that a step recess channel 110 includes a recess R and a first step S1 and a second step S2 extending from the recess R. The remaining components of embodiments of FIG. 6 are the same as those of embodiments of FIG. 1. Since the step recess channel 110 includes two steps, an effective channel length can be effectively increased.

Figure 7:
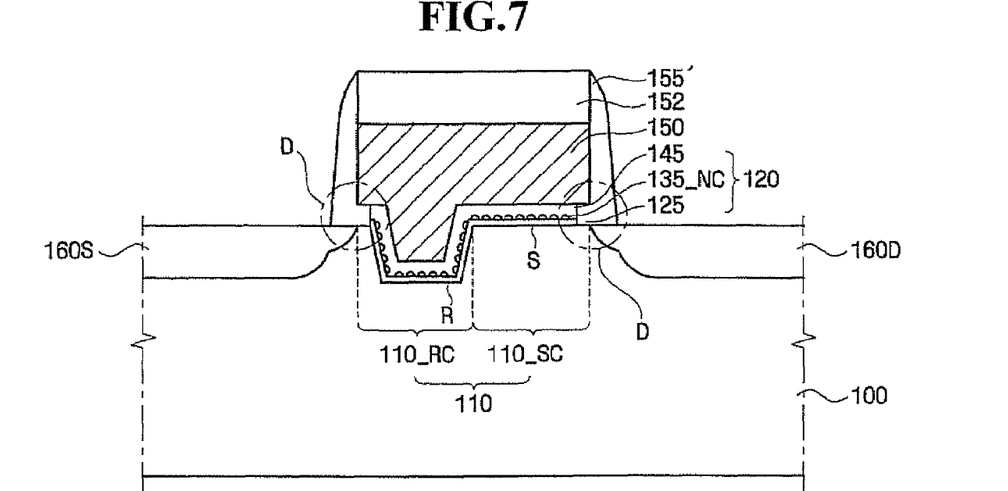

FIG. 7 is a cross-sectional view of a unit memory cell of a nonvolatile memory integrated circuit device according to still other embodiments of the present invention.

Embodiments of FIG. 7 are different from embodiments of FIG. 1 in that both sides of a trapping structure 120 (dotted circle D) are recessed towards inside of a gate 150 and a spacer 155' fills the recessed sides. The remaining components of the embodiments of FIG. 7 are the same as those embodiments of FIG. 1. Through recessing, the trapping structure 120 may be prevented from overlapping the source region 160S and the drain region 160D that are laterally diffused. Thus, it is possible to reduce or prevent difficulty in erasing charges trapped in nano-crystals of a region overlapping with the source region 160S and the drain region 160D during an erase operation.

Figure 8:
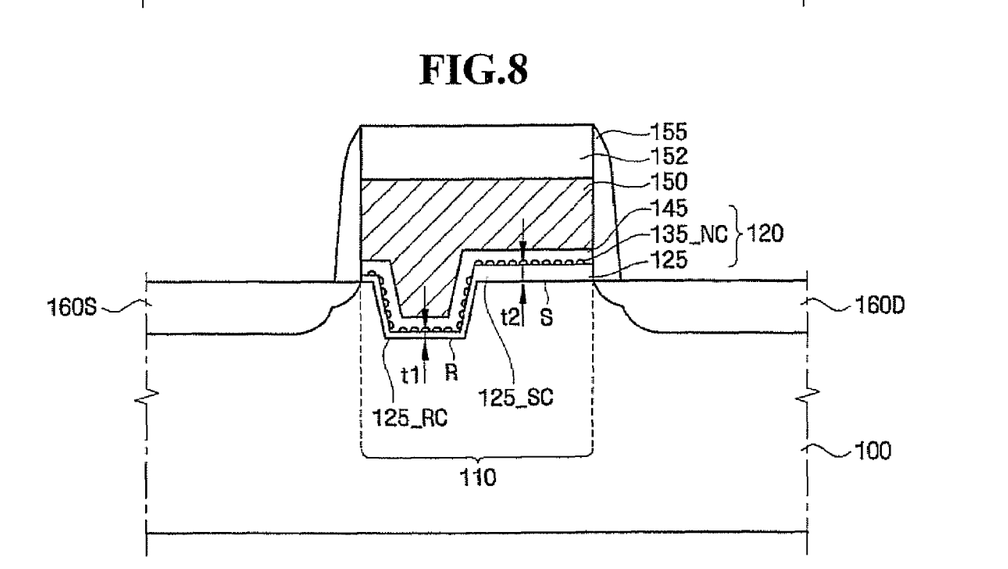

FIG. 8 is a cross-sectional view of a unit memory cell of a nonvolatile semiconductor integrated circuit device according to still other embodiments of the present invention.

Embodiments of FIG. 8 are different from embodiments of FIG. 1 in that the thickness t1 of a tunneling layer 125_RC on a recess channel 110_RC is smaller than the thickness t2 of a tunneling layer 120_S on a step channel 110_S. The remaining components of embodiments of FIG. 8 are the same as those of embodiments of FIG. 1. More hot electrons can be effectively injected in the source side where a tunneling insulating layer 120RC is thin. Thus, a threshold voltage shift due to source-side injection and a threshold voltage shift due to drain-side injection can be more clearly distinguished, thereby more clearly distinguishing program acceptance windows.

The embodiments shown in FIGS. 4 through 8 can be applied separately or through a combination or subcombination thereof. For example, an upper portion of a recess may be chamfered and a lower portion of the recess may be formed to have a spherical shape.

Figure 9A:
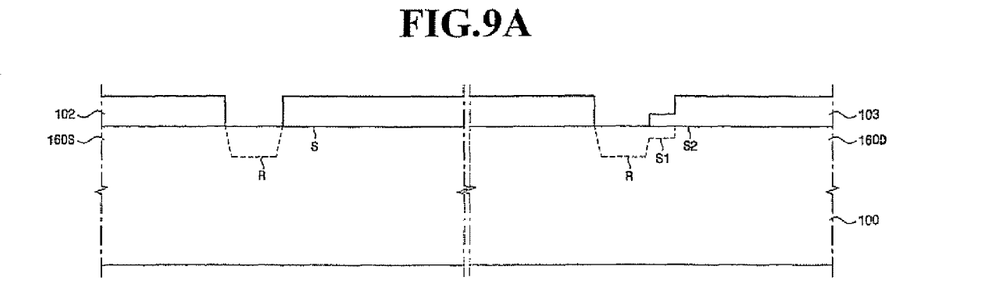
FIGS. 9A through 9C are cross-sectional views for explaining methods for fabricating a nonvolatile memory cell of a nonvolatile memory integrated circuit device according to embodiments of the present invention.
Figure 9B:
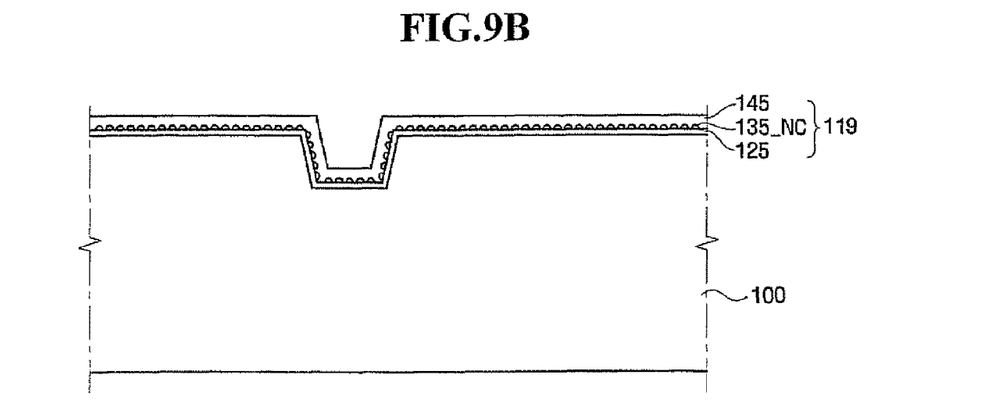
Figure 9C:
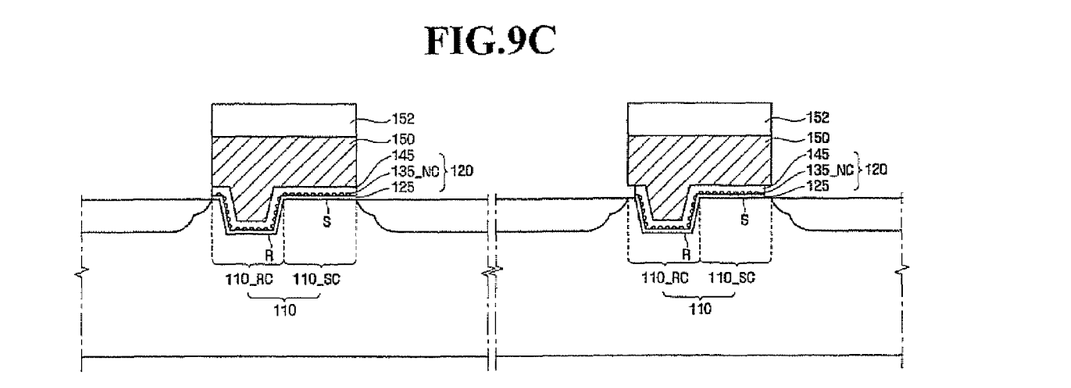

FIGS. 9A through 9C are cross-sectional views for explaining methods for fabricating a nonvolatile memory cell of a nonvolatile memory integrated circuit device according to embodiments of the present invention.

Referring to FIG. 9A, a recess R is formed in a substrate 100.

As shown in the left side of FIG. 9A, after an etching mask 102 defining the recess R is formed in an active region defined by a device isolation region (not shown), the recess R is formed by an etching process.

After forming the recess R, the etching mask 102 may be partially removed to enlarge the width of a region exposed by the etching mask 102 and an upper portion of the exposed recess R may be chamfered through chemical dry etch and/or a wet etchant having an isotropic etching characteristic (see FIG. 4).

Alternatively, after forming the recess R, a lower portion of the recess R may be formed in a spherical shape through chemical dry etch and/or a wet etchant having an isotropic etching characteristic (see FIG. 5).

Alternatively, as shown in the right side of FIG. 9A, two step recess regions R, S1, and S2 may be formed by forming an etching mask 103 for forming a recess R into a photoresist pattern exposing a portion of the substrate 100 and having portions of different thicknesses at a side of the exposed region and etching the substrate 100 using the etching mask 103.

Although not shown in the figures, ion injection for forming a well and channel ion injection may be performed after forming the recess R.

Referring to FIG. 9B, a tunneling layer 125, charge trapping nano-crystals 135_NC, and a blocking layer 145 are sequentially formed.

The tunneling layer 125 may be a single layer or a stacked layer of $SiO_2$, SiON, $La_2O_3$, $ZrO_2$, and/or $Al_2O_3$. The tunneling layer 125 may be formed to a thickness of about 1-100 nm, and in some embodiments about 4.5-5.5 nm, using chemical vapor deposition (CVD) and/or atomic layer deposition (ALD).

Specifically, a tunneling layer may be primarily formed to then the tunneling layer on the recess R may be removed, and a tunneling layer may be secondarily formed on the step S. Thus, a thickness of the tunneling layer 125 on the recess R may be smaller than a thickness of the tunneling layer 125 on the step S.

When the charge trapping nano-crystals 135_NC are formed to have a single-layer structure, they may be semiconductor nano-crystals and/or dielectric nano-crystals. For example, when a silicon source gas and $H_2$ react for about 10-15 seconds at about 500-620° C. through low pressure chemical vapor deposition (LPCVD), polysilicon nano-crystals can be formed. By further processing the surface of the tunneling layer 125 with a 1% HF solution prior to LPCVD, nano-crystals isolated from each other with a high precision of, e.g., about $5 \times 10^{11} - 1 \times 10^{11}/cm^2$, can be formed.

Similarly, germanium nano-crystals may be formed using a germanium source gas, instead of the silicon source gas, as a reaction gas. In addition, silicon nitride nano-crystals and/or germanium nitride nano-crystals may be formed by nitridating semiconductor nano-crystals. Alternatively, after a dielectric layer made of oxide such as SiN, BN, SiC, SiON, Al, Zr, Hf, and/or La, and/or oxynitride such as Al, Zr, Hf, and/or La is formed, semiconductor nano-crystals (NC2 of FIG. 1) are formed on the dielectric layer and the dielectric layer is etched using the etching mask, thereby forming the dielectric nano-crystals (NC1 of FIG. 1). Thus, the charge trapping nano-crystals can be formed to have a multi-layered structure.

The blocking layer 145 is formed of a single layer or a combination layer comprising $SiO_2$, $Hf_xO_y$, $Al_xO_y$, $Zr_xO_y$, $Ta_xO_y$, $Hf_xSi_{1-x}O_y$, and/or $Hf_xSi_{1-x}O_yN_z$. The blocking layer 145 is formed to a thickness of about 5-15 nm by CVD or LPCVD.

Next, the blocking layer 145, the charge trapping nano-crystals 135_NC, and the tunneling layer 125 are isolated for each active region, thereby forming a free trapping structure 119.

Referring to FIG. 9C, after a conductive layer and a capping layer for forming a gate are sequentially formed and then patterned, the gate 150, a capping layer pattern 152, and the charge trapping structure 120 are completed.

The conductive layer for forming a gate 150 may be a single layer such as a doped polysilicon layer, a metal silicide layer or a metal layer, or a multiple layer such as a metal/metal barrier layer, a metal/doped polysilicon layer, a metal silicide/metal silicide layer and/or a metal silicide layer/doped polysilicon layer. Examples of the metal include, but are not limited to, W, Ni, Co, Ru—Ta, Ni—Ti, Ti—Al—N, Zr, Hf, Ti, Ta, Mo, Ta—Pt, Ta—Ti, and/or W—Ti, examples of the metallic barrier material include, but are not limited to, WN, TiN, TaN, TaCN, and/or MoN, and examples of the metal silicide include, but are not limited to, WSix, CoSix and/or NiSix.

The capping layer pattern 152 may be formed using a nitride layer, a high-temperature, low-pressure deposition oxide layer, or a stacked layer thereof.

Thereafter, an oxidation process for removing a defect to a lattice structure and/or an undesired trap site caused in patterning is performed. When the length of the step channel 110_SC is substantially the same as that of a bird's beak of the tunneling layer 125 during the oxidation process, the thickness of the tunneling layer on the step channel 110_SC may be larger than that of the recess channel 110_RC after the oxidation process.

By performing wet etching prior to ion injection, the charge trapping structure 120 may be recessed as shown in the right side of FIG. 9C.

Finally, ions for forming the source region 160S and the drain region 160D are injected. The source region 160S and the drain region 160D may be formed, for example, by forming only a low-concentration impurity regions or forming low-concentration impurity region after the oxidation process, forming an insulating layer, and then forming high-concentration impurity regions according to a desired characteristic of a memory cell.

Thereafter, processes well known to those skilled in the field of semiconductor devices, i.e., a process of forming interconnection lines allowing input/output of electric signals in a memory cell, a process of forming a passivation layer on a substrate, and a process of packaging the substrate, are further performed, thereby completing a nonvolatile memory integrated circuit device. Such processes will be described briefly.

Figure 10A:
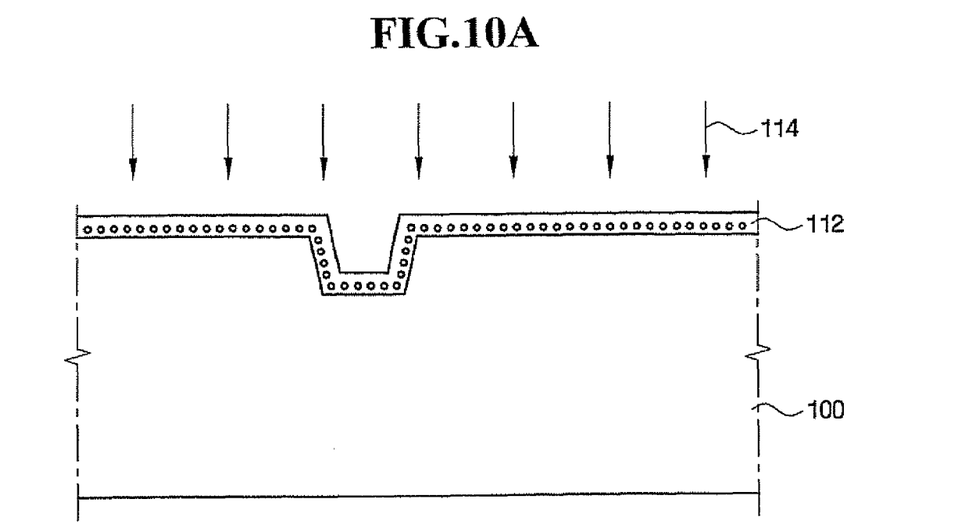
FIGS. 10A and 10B are cross-sectional views for explaining methods for fabricating a nonvolatile memory cell of a nonvolatile memory integrated circuit device according to other embodiments of the present invention.
Figure 10B:
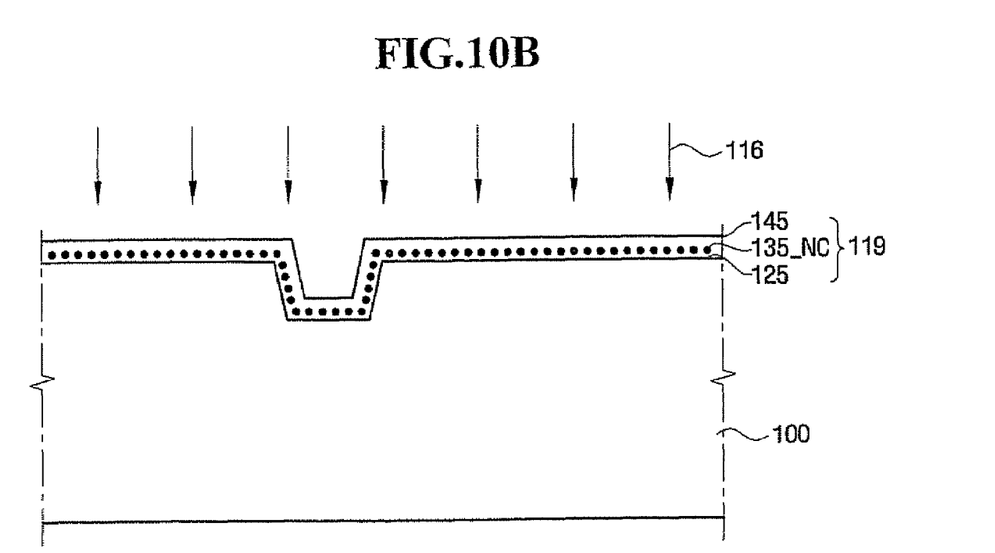

FIGS. 10A and 10B are cross-sectional views for explaining methods for fabricating a nonvolatile memory cell of a nonvolatile memory integrated circuit device according to other embodiments of the present invention.

Referring to FIG. 10A, after the recess R is formed as described with reference to FIG. 9A, an oxide layer 112 is formed on the entire surface of the substrate 100. The thickness of the oxide layer 112 may be the same as the total thickness of the tunneling layer 125, the nano-crystals 135_NC, and the blocking layer 145 forming a final charge trapping structure (120 of FIG. 1). Next, a semiconductor ion injection process 114 is performed. Small circles (○) in the oxide layer 112 are used to schematically indicate injected ions.

Referring to FIG. 10B, the injected semiconductor ions are crystallized through a crystallization thermal process 116, thereby forming a plurality of nano-crystals 135_NC. The crystallization thermal process 116 may be performed at, but is not limited to, about 950° C. The size or density of the nano-crystals 135_NC may be adjusted according to conditions of the crystallization thermal process 116.

The subsequent process may be performed in the same way as described with reference to FIG. 9C and a detailed description thereof need not be repeated.

Figure 11:
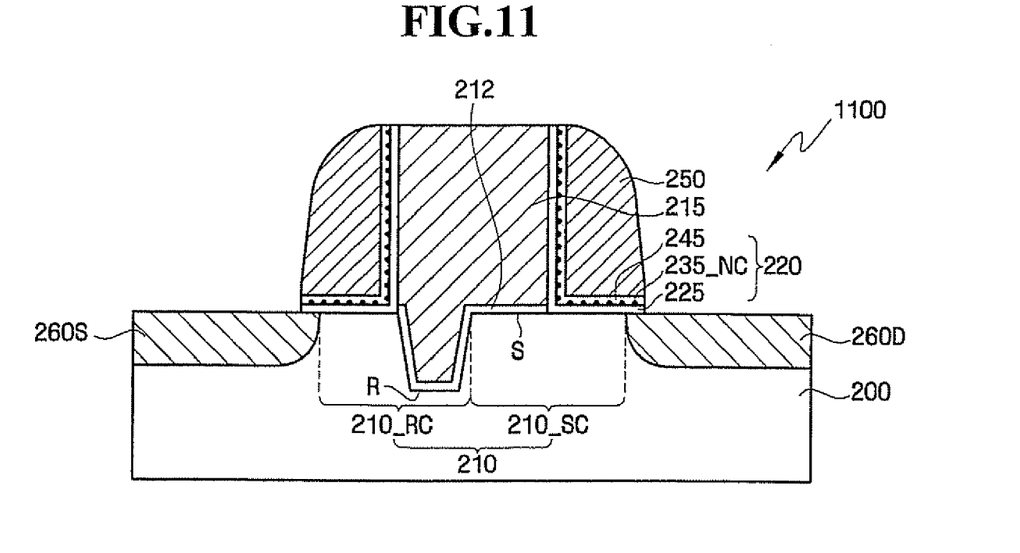
FIG. 11 is a cross-sectional view of a unit memory cell of a nonvolatile memory integrated circuit device according to other embodiments of the present invention.

FIG. 11 is a cross-sectional view of a unit memory cell of a nonvolatile memory integrated circuit device according to other embodiments of the present invention.

Embodiments of FIG. 11 are different from embodiments of FIG. 1 in that a unit memory cell includes sidewall gates 250 at both sides of a main gate 215 and a trapping structure 220 between the sidewall gates 250 and a substrate 200 forming a channel region. Since the trapping structure 220 exists only at both sides of a step recess channel 210, a localized fraction effect of source-side injection and drain-side injection may be improved. Accordingly, in these embodiments, the gate 215 includes a gate sidewall that extends outside the trench R away from the substrate 200, and the plurality of charge trapping nano-crystals 235_NC extend both along the substrate 200 outside the trench R and along the gate sidewall outside the trench R away from the substrate 200.

More specifically, a gate insulating layer 212 is interposed between portions of the step recess channel 210 formed in the substrate 200, thereby forming the main gate 215. The sidewall gates 250 are formed at sidewalls of the main gate 215, and the trapping structure 220 is interposed between the sidewall gates 250 and the main gate 215 and between the sidewall gates 250 and the remaining portions of the step recess channel 210. The trapping structure 220 includes a tunneling layer 225, charge trapping nano-crystals 235_NC, and a blocking layer 245 like in embodiments of FIG. 1. A source region 260S and a drain region 260D are formed in a substrate 200 and aligned with the sidewall gates 250.

The embodiments shown in FIGS. 4 through 8 may also be applied to the nonvolatile memory integrated circuit device shown in FIG. 11 and a description thereof need not be repeated.

Figure 12A:
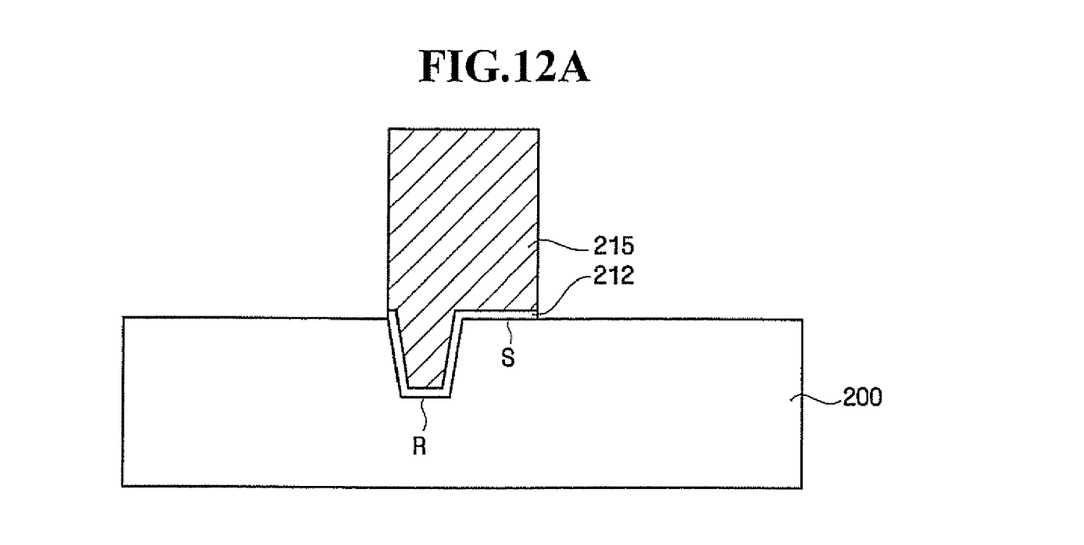
FIGS. 12A through 12C are cross-sectional views for explaining a method for fabricating a unit memory cell of a nonvolatile memory integrated circuit device according to other embodiments of the present invention.
Figure 12B:
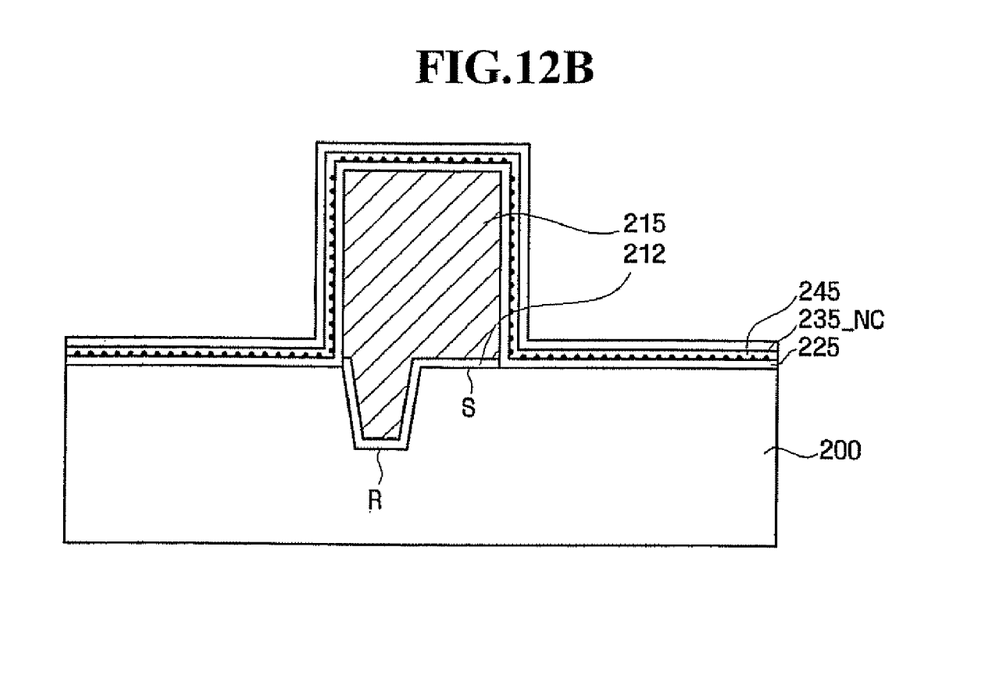
Figure 12C:
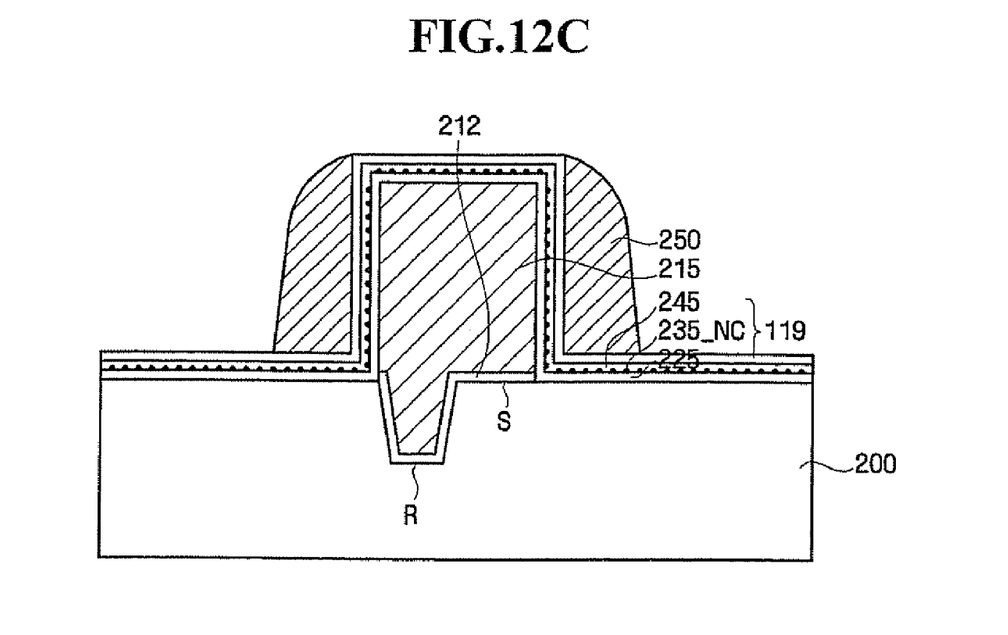

FIGS. 12A through 12C are cross-sectional views for explaining methods for fabricating a unit memory cell of a nonvolatile memory integrated circuit device according to other embodiments of the present invention.

Referring to FIG. 12A, after a recess R and a step S are formed in the substrate 200 using a method for fabricating a nonvolatile memory cell according to embodiments of the present invention, the gate insulating layer 212 and the main gate 215 are formed.

The gate insulting layer 212 is formed to a thickness of about 10-100 nm using $SiO_2$, SiON, SiN, $Si_3N_4$, $ZrO_2$, $HfO_2$, $Ta_2O_5$, $Al_2O_3$, and/or La oxide.

The main gate 215 may be a single layer such as a doped polysilicon layer, a metal silicide layer or a metal layer, or a multiple layer such as a metal/metal barrier layer, a metal/doped polysilicon layer, a metal silicide/metal silicide layer and/or a metal silicide layer/doped polysilicon layer.

Referring to FIG. 12B, the tunneling layer 225, the charge trapping nano-crystals 235_NC, and the blocking layer 245 are sequentially formed on the entire surface of the substrate 200 where the main gate 215 is formed. The types, thicknesses, and methods of forming the charge trapping nano-crystals 235_NC and the blocking layer 245 have been described with reference to FIGS. 9A through 10B and need not be repeated.

Referring to FIG. 12C, the sidewall gates 250 are formed at sidewalls of the main gate 215. The sidewall gates 250 may be formed by forming a conductive layer, which is the same as that used for the main gate 215, on the entire surface of the entire surface of the substrate 200 and then etching back the conductive layer.

The tunneling layer 225, the charge trapping nano-crystals 235_NC, and the blocking layer 245 are sequentially etched using the sidewall gates 250 as etching masks, thereby completing a charge trapping structure (220 of FIG. 11). At this time, the tunneling layer 225, the charge trapping nano-crystals 235_NC, and the blocking layer 245 on the top surface of the main gate 215 can also be removed. Next, ion injection for forming the source region 260S and the drain region 260D is performed, thereby completing the nonvolatile memory cell as shown in FIG. 11.

Hereinafter, a case where a memory cell structure according to embodiments of the present invention is applied to a NAND-type nonvolatile semiconductor integrated circuit device will be described with reference to FIGS. 13 through 15.

Figure 13:
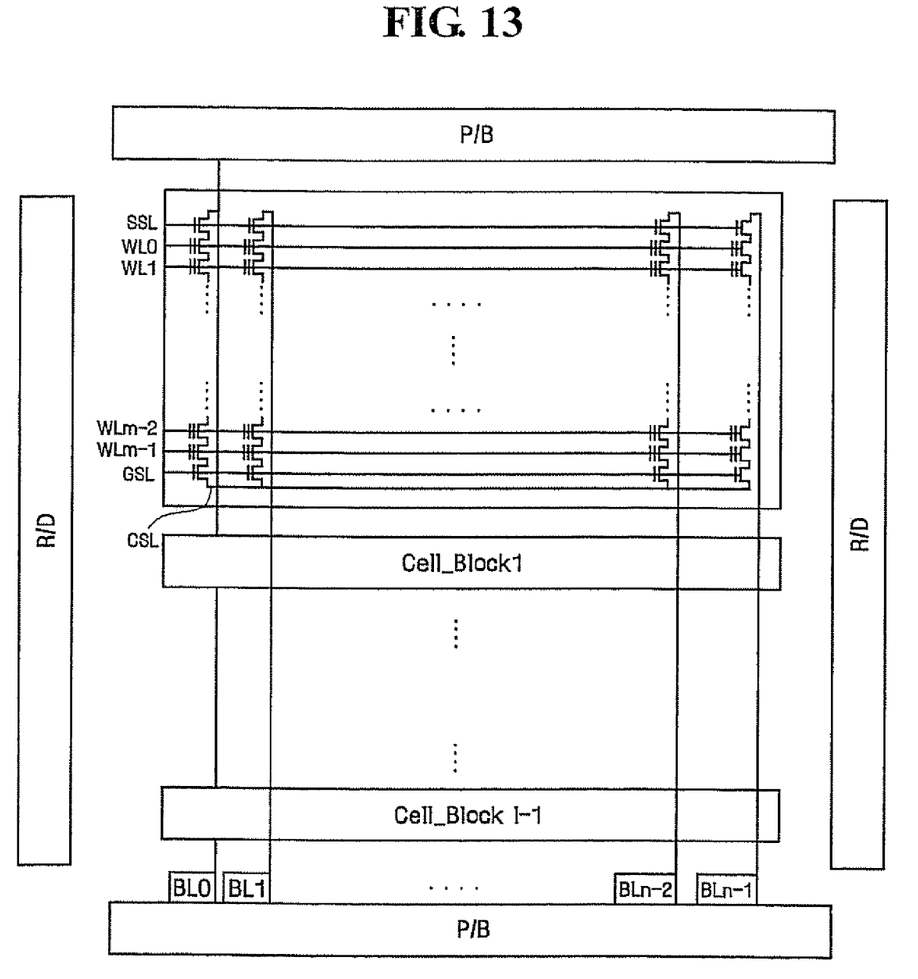
FIG. 13 is an equivalent circuit diagram of an NAND-type nonvolatile memory integrated circuit device using a memory cell structure according to embodiments of the present invention.
Figure 14:
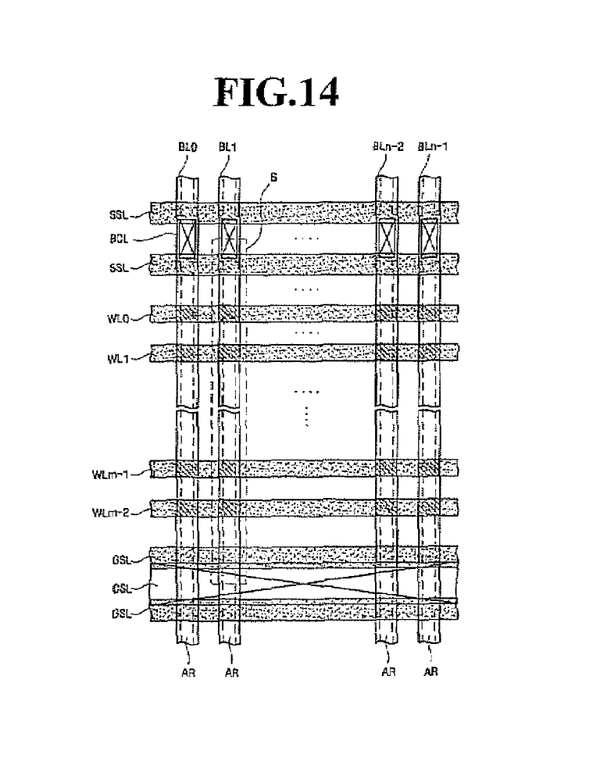
FIG. 14 is a partial plane view of a cell array region of the NAND-type nonvolatile memory integrated circuit device of FIG. 13.

FIG. 13 is an equivalent circuit diagram of an NAND-type nonvolatile semiconductor integrated circuit device using a memory cell structure according to embodiments of the present invention, and FIG. 14 is a partial plan view of a cell array region of the NAND-type nonvolatile semiconductor integrated circuit device of FIG. 13.

Referring to FIGS. 13 and 14, a plurality of cell blocks Cell_Block 1-I-1 are arranged in a cell array region A of the NAND-type nonvolatile memory integrated circuit device. A plurality of active regions AR are arranged for each cell block Cell_Block and a string selection line SSL, a ground selection line GSL, and a common source line CSL are arranged perpendicular to the active regions AR. A plurality of word lines WL0-WLm−1 are arranged between the string selection line SSL and the ground selection line GSL. A plurality of bit lines BL0-BLn−1 are arranged to intersect the plurality of word lines WL0-WLm−1. Memory cells MC0-MC(m−1)×(n−1) are defined in regions where the bit lines BL and the word lines WL intersect. A string selection transistor SST and a ground selection transistor GST are defined in each region where the bit line BL and the string selection line SSL intersect with each other and the bit line BL and the ground selection line GSL intersect with each other. The string selection transistor SST, the plurality of memory cells MC0-MC(m−1)×(n−1), and the ground selection transistor GST are serially connected, thereby forming a single string S. Strings formed for each cell block in each bit line BL are connected in parallel. In other words, a drain of the string selection transistor SST of each string S is connected to the bit line BL through a bit line contact BLC. A source of the ground selection transistor GST is connected to the common source line CSL. Page buffers P/B are arranged on upper and lower portions of a peripheral circuit region B and row decoders R/D are arranged at left and right sides of the peripheral circuit region B.

Figure 15:
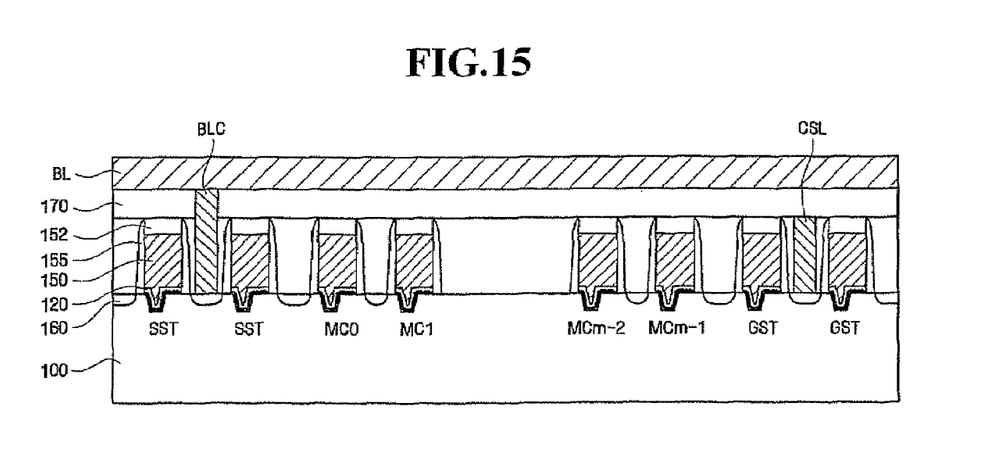
FIG. 15 is a cross-sectional view of an NAND-type nonvolatile memory integrated circuit device using the memory cell structure of FIG. 1.

FIG. 15 is a cross-sectional view of an NAND-type nonvolatile memory integrated circuit device using the memory cell structure of FIG. 1.

Referring to FIG. 15, a plurality of active regions AR are defined by a shallow trench device isolation region formed in the substrate 100. Wells (not shown) for optimizing the characteristics of transistors formed in a cell array region and a peripheral circuit region may be formed in the substrate 100. For example, a pocket-type p well may be formed in the cell array region and an n well and a p well may be formed in the peripheral circuit region.

The string selection transistor SST, the plurality of memory cells MC0-MCm−1, and the ground selection transistor GST are serially connected to share a source/drain region 160 in each of the active regions AR, thereby forming a string S. The string S is connected to the bit line BL through the bit line contact BLC.

The string selection transistor SST is coupled to the string selection line SSL, a memory cell is coupled to each of the word lines WL0 0 WLm−1, and the ground selection transistor GST is coupled to the ground selection line GSL. In some embodiments, the string selection transistor SST, the plurality of memory cells MC0-MCm−1, and the ground selection transistor GST all include the charge trapping structure 120 and the gate 150 formed in the step recess channel region, the capping layer 152, and the spacer 155 as described herein.

The common source line CSL is connected to a source of the ground selection transistor GST and the bit line BL is connected to a drain of the string selection transistor SST through the bit line contact BLC. Reference numeral 170 indicates an interlayer insulating layer.

Although not shown in the figures, the embodiments of the present invention can also be applied to an NOR-type nonvolatile memory integrated circuit device.

As described above, nonvolatile memory integrated circuit devices having 2 bit memory cells and fabrication methods of embodiments of the present invention according to the present invention can provide one or more of the following and/or other advantages:

Since an effective channel length may increase due to a step recess channel, stable local programming is possible and 2-bit information can be stably stored.

Effective channel length increase due to a step recess channel can reduce a self-limiting effect occurring when programming hot carriers.

By forming a charge trapping structure with nano-crystals, it is possible to reduce or prevent source-side injected electrons and/or drain-side injected electrons from being laterally diffused. Therefore, the size of a memory cell can be scaled down to a nano level or less.

In the drawings and specification, there have been disclosed embodiments of the invention and, although specific terms are employed, they are used in a generic and descriptive sense only and not for purposes of limitation, the scope of the invention being set forth in the following claims.

What is claimed is:

1. A multi-bit nonvolatile memory cell comprising:
   a substrate;
   spaced apart source and drain regions in the substrate;
   a trench in the substrate between the spaced apart source and drain regions;
   a plurality of charge trapping nano-crystals on the substrate between the spaced apart source and drain regions;
   a gate on the substrate that includes a protrusion portion that extends into the trench, wherein the protrusion portion is closer to the source region than to the drain region; and
   a layer between the nano-crystals and the substrate, that is thicker on the substrate outside the trench than in the trench.

2. The multi-bit nonvolatile memory cell of claim 1, wherein the substrate outside the trench is substantially as long as a bird's beak length of a tunneling layer of the nonvolatile memory cell.

3. The multi-bit nonvolatile memory cell of claim 1 wherein the plurality of charge trapping nano-crystals extend both into the trench and along the substrate outside the trench.

4. The multi-bit nonvolatile memory cell of claim 1 wherein the gate includes a gate sidewall that extends outside the trench away from the substrate and wherein the plurality of charge trapping nano-crystals extend both along the substrate outside the trench and along the gate sidewall outside the trench away from the substrate.

5. The multi-bit nonvolatile memory cell of claim 1 wherein the gate extends both into the trench and on the substrate outside the trench.

6. The multi-bit nonvolatile memory cell of claim 1 wherein the trench is closer to the source region than to the drain region.

7. The multi-bit nonvolatile memory cell of claim 1 wherein the trench includes an opening, a floor and a sidewall therebetween, and wherein the opening is chamfered.

8. The multi-bit nonvolatile memory cell of claim 1 wherein the trench includes an opening, a floor and a sidewall therebetween, and wherein the floor is nonplanar.

9. The multi-bit nonvolatile memory cell of claim 1 wherein the trench includes an opening, a floor and a sidewall therebetween, and wherein the sidewall is stepped.

10. The multi-bit nonvolatile memory cell of claim 1 wherein the plurality of charge trapping nano-crystals extend on the substrate adjacent to, but spaced apart from, the source and drain regions.

* * * * *